United States Patent [19]

Tippetts

[11] 4,192,449
[45] Mar. 11, 1980

[54] CODING SYSTEM

[75] Inventor: K. Boyd Tippetts, Glendale, Ariz.

[73] Assignee: Honeywell Information Systems Inc., Phoenix, Ariz.

[21] Appl. No.: 921,664

[22] Filed: Jul. 3, 1978

[51] Int. Cl.² .............................................. G06K 1/10
[52] U.S. Cl. ...................................... 234/111; 83/228; 83/571
[58] Field of Search .......................... 83/571, 573, 228; 234/111, 116

[56] References Cited

U.S. PATENT DOCUMENTS

| | | | |
|---|---|---|---|
| 2,357,557 | 9/1944 | Sherman et al. | 83/228 X |
| 2,466,436 | 4/1949 | Jones | 83/228 |
| 2,827,120 | 3/1958 | Davidson et al. | 83/228 |
| 3,491,941 | 1/1970 | Bernazani, Jr. | 234/116 X |
| 3,510,056 | 5/1970 | East et al. | 234/116 X |
| 3,512,441 | 5/1970 | Benediut | 83/571 |
| 3,554,069 | 1/1971 | Wohlman, Jr. | 234/111 X |
| 3,750,502 | 8/1973 | Ball | 83/571 X |
| 3,780,939 | 12/1973 | Woodie | 234/116 X |

*Primary Examiner*—J. M. Meister

*Attorney, Agent, or Firm*—E. W. Hughes; W. W. Holloway, Jr.; R. T. Reiling

[57] ABSTRACT

A coding system for applying identifying data bits to a segment of a film strip having an integrated circuit bonded to a lead pattern formed on the segment by selectively piercing marking areas of the segment. A die of a punch press has a predetermined number, normally a power of 2, of pin holes which are arranged in a predetermined array. Piercing punches, one for each pin hole, are mounted on a punch holder for limited vertical movement with respect to the punch holder. The punches are arranged so each can be inserted into its corresponding pin hole. To prevent movement of piercing punches relative to the punch holder on which it is movably mounted and to vary the data applied to a segment, a backup pin is placed between a punch backup plate and the head of the piercing punch. When the punch holder is moved by the actuator of the punch press toward the die, the piercing punches held substantially immovable by backup pins are forced into their corresponding pin holes in the die to form holes in the marking areas of a segment positioned on the die by pilot pins mounted on the punch holder. The presence or absence of holes at predetermined points in the coding areas of the segment represent data.

3 Claims, 5 Drawing Figures

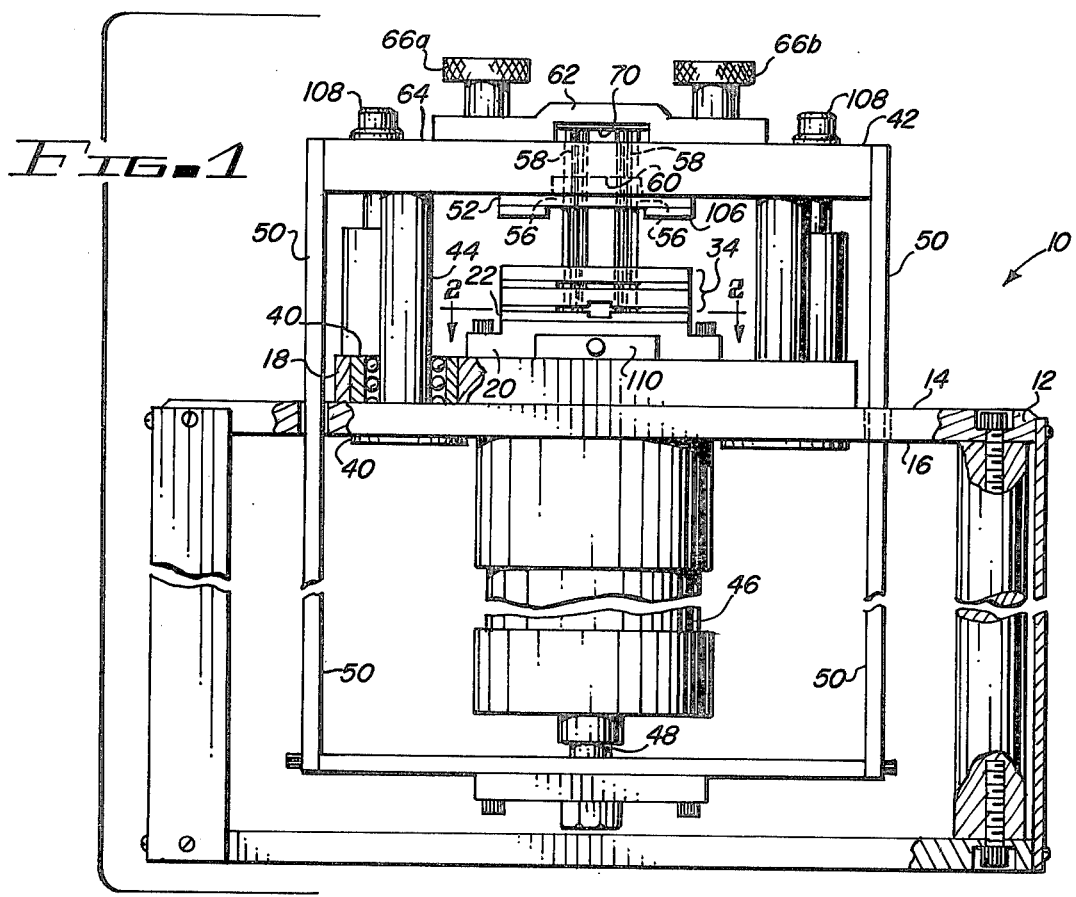
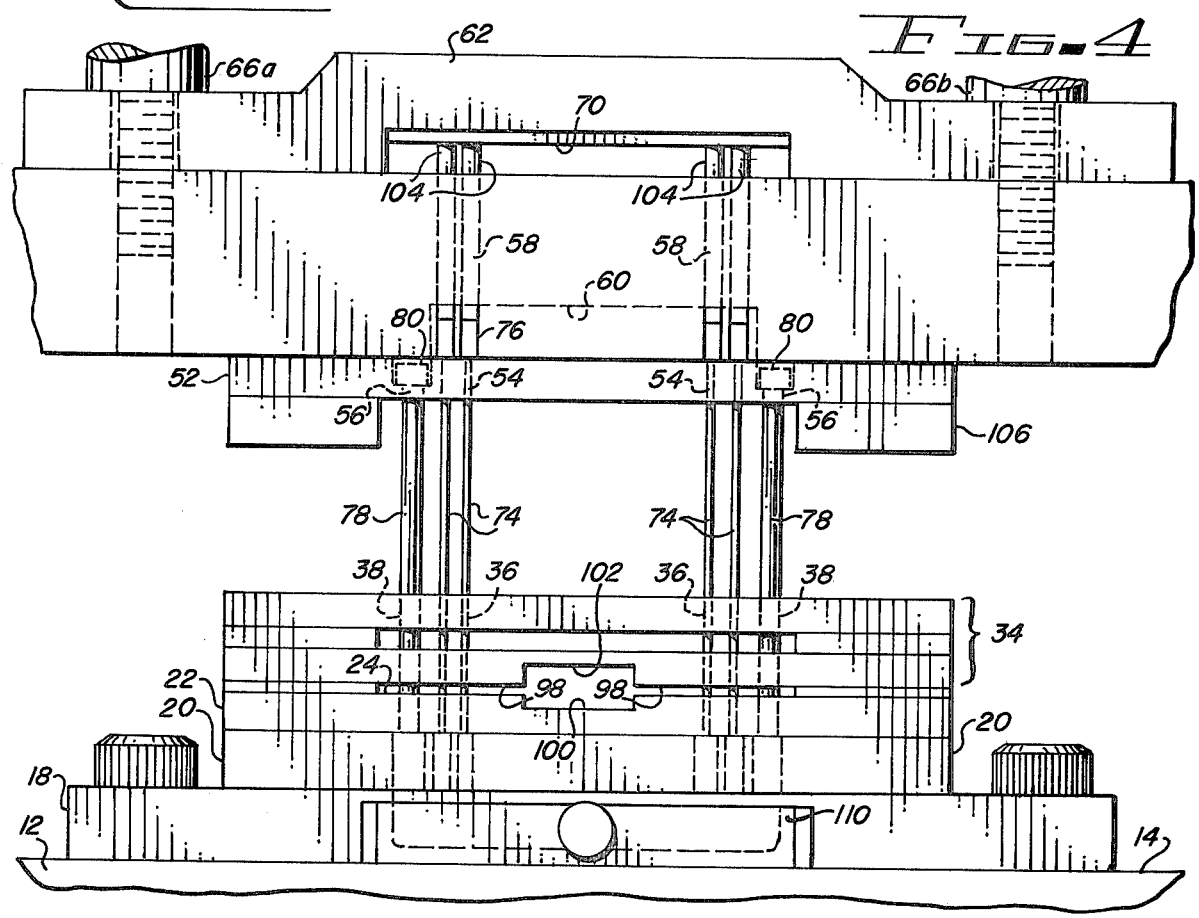

4,192,449

CODING SYSTEM

BACKGROUND OF THE INVENTION

1. Field of the Invention

This invention is in the field of adjustable punch presses for applying to each segment of a strip of such segments data identifying, for example, the integrated circuit chip mounted on the leads of a lead pattern of such a segment.

2. Description of the Prior Art

The development of integrated circuits (IC) chips, particularly medium and large scale IC chips has created the need for improved manufacturing processes to automate the bonding of such chips on substrates or in individual packages. It is known to attach IC chips to lead frames formed on a relatively long strip of a tape-like carrier similar to standard motion picture film. The lead patterns are formed from a thin metallic layer of a good electrical conductor such as copper which is bonded to the film. The strip, typically 35 mm wide, is divided into segments, typically two segments for each 35 mm of length of the strip. The layer of copper of each segment is formed into a lead pattern of a desired configuration by conventional photoetching processes. Each segment is provided with a window over which the leads of the lead pattern extend. Subsequently the IC chips are bonded to ends of the leads extending over the window of a segment. The lengths of such strips of film are such that to facilitate handling and shipping the strips of film with an IC chip secured to the leads of each lead pattern, are wound on reels. As a general rule IC chips of the same type are mounted on the segments of a given film strip.

To facilitate handling the segments and their attached IC chips prior to the chips and their leads being excised from the segments, the segments of a strip are separated by cutting the strip at segment boundaries which separate the segments from one another. The separated and individual segments are then mounted in a fixture such as is disclosed in U.S. Pat. No. 4,007,479 which issued on Feb. 8, 1977 or in U.S. Pat. No. 4,067,496 which issued on Jan. 17, 1978.

As mentioned above, as a general rule, IC chips of the same type are bonded to the leads of segments of a given strip, and information indentifying the chips is marked on the reel on which the strip is wound for example. When segments of a given type are mounted on non-reusable fixtures such as are illustrated in FIG. 2 of U.S. Pat. No. 4,007,479, indicia, or data, identifying the chip held by the fixture, the source of the chip for example and other relevant information can be printed on the outer surface of the fixture.

As reusable fixtures such as those illustrated in U.S. Pat. No. 4,069,496 have replaced nonreusable fixtures, particularly in high volume production situations, a way of identifying the chip mounted on a given segment and relevant data with respect to the chip is needed which is independent of the fixture or holder. No prior art apparatus for applying such identification data to a segment carrying such a chip is known to the applicant.

It is important that the identification data be machine readable so that record keeping can be automated; that applying such data and its presence on the segment not have any adverse impact on subsequent manufacturing steps and processes used in mounting the chip and its leads on a substrate or in a package; and that there be no damage to the chip and its leads. While the data for each chip attached to the segments of a given film strip are generally the same and therefore the identification data applied doesn't change for a given film strip, nevertheless the apparatus for applying the data must be easily changeable by an operator prior to applying the appropriate identification data, for example, to each segment of a strip of film sufficiently early in the manufacturing process so that the possibility of errors in identifying the chips of that strip cannot occur.

SUMMARY OF THE INVENTION

The present invention provides a coding system which applies "n" bits of data to marking areas of a segment of a film strip for example by piercing, at selected points in the marking areas of the base layer of the segment to produce small circular openings or by not piercing the base layer at such points. The presence or absence of such an opening at a selected point represents the two possible values of a binary digit. Each film strip has two substantially parallel rows of sprocket holes, one row along each side of the film strip. The sprocket holes are substantially of equal size and are uniformly spaced from one another. Each segment has at least four placement sprocket holes. A lead pattern is located between the rows of sprocket holes and the common segment boundaries of adjacent segments. The area of each segment between the rows of sprocket holes and the lead pattern defining marking areas within which identification data, for example, can be applied. The two areas of each segment can also be divided into two coding blocks which are spaced from the reference sprocket holes of each row of sprocket holes of each segment. A punch press has a die having "n" pin holes arranged in a predetermined array which die is mounted on the base plate of the press. Mounted on the punch holder of the punch press are "n" piercing punches arranged in an identical array with that of the pin holes of the die so that each piercing punch is aligned with the corresponding pin hole of the die. The piercing punches are mounted on the punch holder so that they have limited movement with respect to the punch holder in directions parallel to the directions of movement of the punch holder, toward and away from the base plate of the punch press. The punch holder is mounted on a top plate, and the top plate is operatively connected to an actuator mounted underneath the base plate. A backup plate is removably mounted on the top plate. By placing a punch backup pin between the backup plate and the head of a piercing punch and securing the backup plate to the holder, those piercing punches the heads of which contact backup pins are held substantially immovable with respect to the top plate and the punch holder so that when the punch press goes through a cycle of operation, those piercing punches held immovable by backup pins will be forced to enter their corresponding pin holes in the die. The piercing punches free to move with respect to the top plate and the punch holder will not be forced into their corresponding pin holes in the die. Pilot pins, or pilots, are mounted on the punch holder which pilot pins enter the placement sprocket holes of each segment to position accurately a segment so that its marking areas overlie the pin holes of the die before the piercing punches contact the upper surfaces of the segment. Openings are formed in the marking areas of the segment at those points which coincide with the piercing punches which are prevented from moving with respect to the punch holder by backup pins. No openings are formed at those points in the marking area which coincides with the piercing punches which are not inhibited from moving with respect to the punch holder.

The present invention solves the prior art problem of providing apparatus for applying identification data to the marking areas of a segment of a strip of laminar material which identifies the chip secured to the segment and other relevant data concerning the chip. The apparatus of the invention performs its function with precision, reliably and with essentially no risk of damage to the IC chip mounted on each segment.

It is therefore an object of this invention to provide apparatus for applying machine readable data to segments of a strip of ilm.

It is another object of this invention to provide apparatus for applying machine readable data to segments of a strip of film in which the data to be applied can be easily and reliably varied by the operator It is still another object of this invention to provide apparatus for applying machine readable data to segments of a strip of film which apparatus does not damage the segment and the objects attached to the segment; and which does not have a deleterious effect on subsequent manufacturing operations utilizing such segments and the objects attached thereto.

BRIEF DESCRIPTION OF THE DRAWINGS

Other objects, features and advantages of the invention will be readily apparent from the following description of certain preferred embodiments thereof, taken in conjunction with the accompanying drawings, although variations of modifications may be effected without departing from the spirit and scope of the novel concepts of the disclosure, and in which;

FIG. 1 is a front elevation of the invention;

FIG. 4 is an enlarged and partly broken away section taken on line 4—4 of FIG. 3;

DESCRIPTION OF THE PREFERRED EMBODIMENT

Figure 2:
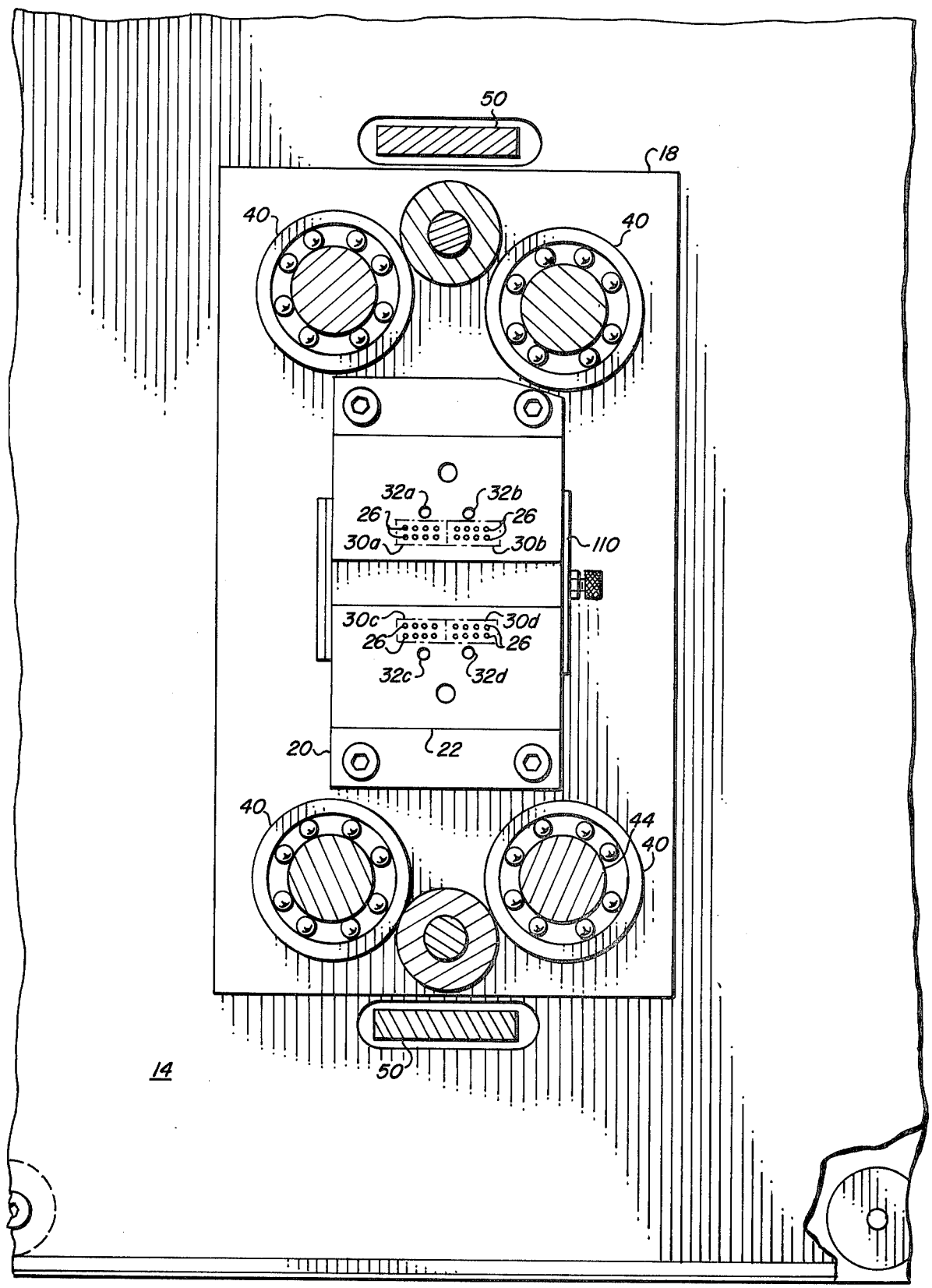
FIG. 2 is an enlarged section taken on line 2—2 of FIG. 1.

Referring to FIG. 1, the apparatus, or coding system, 10, has a bed, or base plate, 12. The upper and lower surfaces, 14, 16 of base plate 12 are substantially planar and parallel. Mounted on upper surface 14 of base plate 12 is bolster 18. A riser 20 is secured to the upper surface of bolster 18. As best seen in FIG. A die plate, or die 22 is mounted on riser 20 so that the upper planar surface 24 of die 22 is substantially parallel to the upper surface 14 of base plate 12. Referring to FIG. 2, a plurality, $2^n$ where "n" is an integer, eight in the preferred embodiment, of die pin holes 26 are formed through die 22. Substantially cylindrical pin holes, 26 are arranged in a predetermined array as can be seen in FIG. 2. Each die pin hole, 26, has a longitudinal axis, which is substantially perpendicular to the upper surface, 24 of die 22. Pin holes 26 are arranged into four data blocks, 30$a$–$d$, with eight, $2^3$, pin holes per block in the preferred embodiment. In addition, die 22 has four substantially cylindrical die pilot pin holes 32$a$–$d$, each of which die pilot holes has a longitudinal axis which is substantially perpendicular to the upper planar surface, 24, of die 22.

A lower punch guide plate 34 is mounted on die 22. A plurality, $2^n$, of punch guide holes 36, one for each die pin hole 26 and four pilot guide holes 38 are formed through punch guide plate 34. Each of the substantially cylindrical punch guide holes, 36, has a longitudinal axis as do the substantially cylindrical pilot guide holes 38. Punch guide holes 36 are arranged in an array substantially identifal to, or congruent with, the array of die pin holes, 26 so that when the lower punch guide pilot 34 is properly positioned on die 22, die pin holes 26 are aligned with punch guide holes 36 of plate 34 and the pilot guide holes 38 are aligned with die pilot holes 32.

Four precision guide ball bushings 40 are mounted on base plate 12. Top plate 42 is mounted for reciprocal linear motion with respect to base plate 12 by means of a plurality of four, die posts 44 which move within bushings 40. A linear actuator 46 is mounted on the bottom surface 16 of base plate 12 and its piston rod 48 is connected to top plate 42 by a pair of pull bars 50.

A punch holder 52 is mounted on top plate 42 and is provided with $2^n$ substantially cylindrical punch holes 54 which are formed through punch holder 52. The number of punch holes 54 is equal to the number of pin holes 26, and punch holes 54 are arranged in a predetermined array which is substantially congruent with the array of die pin holes 26. Each punch hole 54 has a longitudinal axis. In addition punch holder 52 is provided with a plurality, 4, of punch pilot holes 56 each of which also has a longitudinal axis.

Top plate 42 is also provided with $2^n$ of substantially cylindrical backup pin hole 58 which are arranged in an array which is substantially congruent with the array of die pin holes 26. Each of the backup pin holes 58 also has a longitudinal axis. A punch head recess 60 is formed in the bottom of top plate 42 and is dimensioned so that the array of backup pin holes 58 will lie within the boundaries of recess 60.

Figure 3:
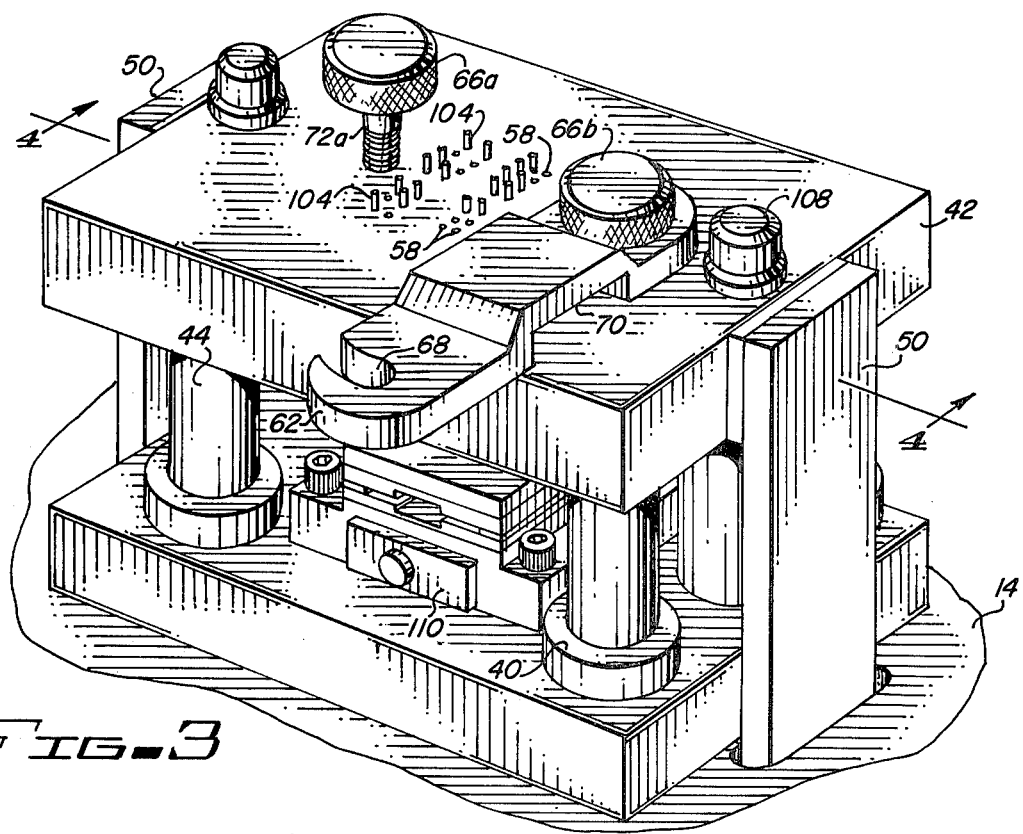
FIG. 3 is a perspective view of the invention.

Backing plate 62 is removably secured to the upper surface 64 of top plate 42 by thumb nuts 66$a$, 66$b$. In a preferred embodiment backing plate 62 is provided with a curved groove 68 so that plate 62 can be pivoted aside, as seen in FIG. 3, to provide access to backup holes 58 in top plate 42. A backup pin channel 70 is formed in the bottom surface of backing plate 62 so that when backing plate 62 is positioned so that bolt 72$a$ is fully within groove 68, the upper surface of channel 70 overlies the array of backup pin holes 58 formed in top plate 42.

Each of the cylindrically shaped punches 74 is provided with a head 76 of larger diameter than the main body of the punch which prevents the punches 74 from falling through the punch holes 54 in punch holder 52. Each of the pilot pins 78 is also provided with an enlarged head 80. The punch pilot holes formed in the punch holder 52 are counterbored as can be seen in FIG. 4 so that the heads 80 of the pilot pins 78 fit within punch holder 52 with substantially no freedom of movement with respect to punch holder 52.

Figure 5:
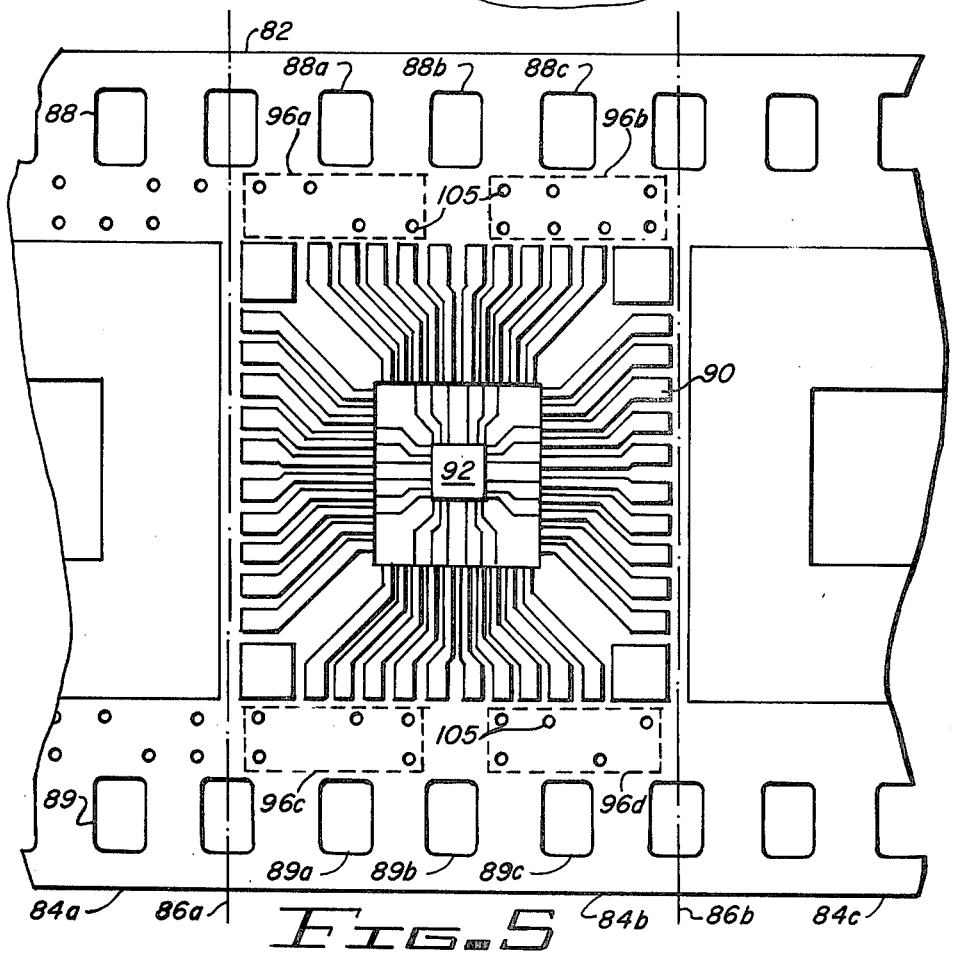
FIG. 5 is an enlarged plan view of a portion of a film strip having adjoining segments.

In FIG. 5, a portion of a film strip 82 is illustrated. Film strip 82 is divided into segments 84$a$, $b$, $c$ and the boundaries between segments 86$a$, $b$ are shown. Along each side of the film strip 82 is located a row of sprocket holes 88, 89 which run along each side of strip 82. The rows of sprocket holes 88, 89 are substantially parallel to one another. The individual sprocket holes, 88, 89 are of substantially the same size and shape and are uniformly spaced from one another. Corresponding sprocket holes in the two rows are substantially aligned.

Within any given segment such as 84b there are located three complete sprocket holes 88a, b, c, and 89a, b, c. The center sprocket holes 88b and 89b are the reference sprocket holes and are used to precisely locate segment 84b. Sprocket holes 88a, and c and 89a, and c are handling sprocket holes. As can be seen in FIG. 5, the portion of each segment between each sprocket hole has a lead pattern 90 formed on the segment and an integrated circuit chip 92 is bonded to the lead pattern 90. The area of the segment between the side boundaries of lead pattern 90 and the two rows of sprocket holes, 88, 89 are the marking areas of a segment and each of the marking areas is divided into two coding blocks, 96a, 96b, and 96c, 96d. Coding blocks 96 are positioned so that in the process of forming data holes in them, substantially no stresses are applied to the reference sprocket holes 88b, 89b particularly those which could distort reference sprocket holes 88b, 89b and thus reduce the accuracy of locating a positioning chip 92 in subsequent manufacturing operation steps.

As can be seen in FIG. 5, each of the coding blocks 96 contains eight possible data holes which represent eight binary digits. It is conventional and convenient to divide each of the coding blocks into two four-bit binary characters or bytes, with the possibility of this being four data holes in a row within each coding block. Each four bit binary character, or byte, can be a representation of a hexidecimal number or a binary coded decimal number. Thus in the preferred embodiment eight hexidecimal digits can be applied to a segment 85 by apparatus 10. In one example the first byte, the upper row of coding block 96a for example, represents the year in which the chip 92 bonded to lead pattern 90 was made, the second byte, the second row of coding block 96a, identifies the chip family, the next two bytes, or characters, identify the chip type, the next three bytes are the lot number of the chip and the last is the lot split.

In operation the film strip 82 is inserted into film guide channel 98 positioned between the upper surface 24 of the die 22 and the lower surface of the lower punch guide plate 34. Clearance recesses 100, 102 are formed in die 22 and lower punch guide plate 34 to provide additional clearance for the integrated circuit chips 92 that are carried on a film strip. The length of the pilot pins 78 and piercing punch pins 74 are such that when actuator 46 positions top plate 42 in its initial, or first, position when top plate 42 is at its maximum distance from base plate 12, punch pins 74 and pilot pins 78 do not protrude into film guide channel 98 so that film strip 82 can be advanced. Film strip 82 is initially positioned by conventional film advancing mechanism which is not illustrated so that the handling or placement sprocket holes 88a, c; 89a, c of segment 84b for example substantially overlie pilot holes 32a, d of die block 22. Pilot pins 78 are rigidly attached to top plate 42 whereas piercing punches 74 are free to move with a limited range of movement relative to the punch holder 52 because of the existence of punch head recess 60 in top plate 42. Coding apparatus 10 is energized by applying air under pressure to actuator 46 to move it to a second position in which the top plate 42 is at a minimum distance from the base plate 12. This movement causes pilot pins 78 to precisely position a segment 84 by causing pilot pins 78 to engage a placement sprocket hole such as sprocket holes 88a, 88c, 89a, 89c, as the pilot pins 75 penetrate die pilot holes 32 to position coding blanks 96 over die pin holes 26.

In the absence of any backup pins 104 being placed in the backup pin holes 58, piercing punches 74 are not forced against and through the laminar layer of a segment 84 and thus do not form data openings in the segment. If a backup pin 104 is positioned in a given backup pin hole 58 in top plate 42 then the piercing punch 74 whose head 76 engages the backup pin will move with top plate 42 and punch holder 52 to form a data hole 105 in the segment.

Changing of the data to be recorded in the coding blocks is accomplished by moving backing plate 62 aside and by the operator inserting backup pins 104 in those backup pin holes 58 where it is desired to form a data hole 105 and not inserting a backup pin 104 or removing it from those backup pin holes 58 where no data hole is to be formed in segment 84b, for example. Downward movement of the top plate 42 from its first to its second position is limited by lower stop 106 which is mounted on the punch holder 52. Upward movement of top plate 42 is limited by the provision of upper stops 108.

In the preferred embodiment the lower punch guide plate 34 is illustrated as being made up of two members which are spaced apart by shims. This particular construction was chosen to facilitate ease of manufacture. Obviously the two members of lower punch guide plate 34 could be made from a single piece of metal. It also should be noted that during operation of apparatus 10 the lower ends of piercing punches 74 are not removed from punch guide holes 36 of lower punch guide plate 34 therefore problems of aligning punches 74 with their corresponding die pin holes 26 are minimized. It should also be noted that backup pin holes 58 in top plate 42, punch holes 54 in punch holder 52, and punch guide holes 36 in lower punch guide plate 34 are aligned with pilot die pilot holes 32 so that the longitudinal axis of all the punch pilot holes are essentially aligned.

The pieces of material that are punched out of the laminar layer of each segment 84 can be collected in drawer 110. After the desired data has been encoded as data holes 105 in a given segment 84 actuator 46 is energized to lift or return top plate 42 back to its initial or first position. Film strip 82 is advanced so that another segment 84, such as segment 84c overlies die 22 so that the data to be recorded or applied to segment 84c is applied in the next cycle of operation of apparatus 10.

Whenever a new strip of film 82 is to be used or processed it is necessary for the operator to determine the data that should be encoded on each segment. It is easy for the operator to loosen thumb nut 66a and pivot to one side backing plate 62 to provide access to the backup pin holes 58 in top plate 42 and backup pins 104 placed in selected ones of said holes 58 where a binary 1 for example is to be applied to the segment and to moit or remove the backup pins 104 from the backup pin holes 58 if a binary 0 is to be applied to the segment 84.

From the foregoing it is believed apparent that applicant has provided apparatus which makes it possible to apply machine readable identification data for example on segments of laminar material which segments are carrying other objects such as integrated circuit chips which apparatus does not damage the object being carried by the segments which are readily machine readable by conventional apparatus.

It should be evident that various modifications can be made to the described embodiment without departing from the scope of the present invention.

What is claimed is:

1. A coding system for applying data by selectively piercing predetermined marking areas of a segment of a film strip, said film strip having two substantially parallel rows of sprocket holes, one row along each side of the film strip, said rows of sprocket holes being substantially uniformly spaced and parallel to one another, a predetermined number "p" of the sprocket holes of each segment being placement sprocket holes, a lead pattern located on the segment between the rows of sprocket holes, the area of the segment between the rows of the sprocket holes and the lead pattern of each segment defining the marking areas, said marking areas being divided into data blocks, comprising:

a base plate having an upper and a lower planar and parallel surfaces;

a die having upper and lower substantially planar and parallel surfaces;

means forming $2^n$ die pin holes through the die where "n" is an integer said die pin holes having a longitudinal axis each of which axis is substantially perpendicular to the planar surfaces of the die; there being $2^{(n-2)}$ die pin holes in each data block;

means forming "p" die pilot holes in the die, each die pilot hole having a longitudinal axis substantially perpendicular to the planar surfaces of the die, said die pin holes and die pilot holes being positioned in the die so that when the pilot holes underlie the placement sprocket holes of a segment, the data blocks of a segment overlie the die pin holes;

means for mounting the die on the base plate so that the upper surface of the die is substantially parallel to the upper surface of the base plate;

a lower punch guide plate having $2^n$ punch guide holes and p pilot guide holes each of said punch and pilot guide holes having a longitudinal axis, said guide holes being positioned so that the punch and pilot guide holes in the lower punch guide plate can be aligned with corresponding die pin holes and die pilot holes in the die;

means for mounting the lower punch guide plate on the die so that the longitudinal axes of the punch and pilot guide holes are substantially aligned with corresponding pin and pilot holes of the die;

a film guide channel formed in the lower punch guide plate;

a top plate having upper and lower parallel planar surfaces mounted for reciprocal linear motion with respect to the base plate;

a punch holder having upper and lower planar surfaces;

actuating means mounted on the lower surface of the base plate for moving the punch holder from a first position in which the punch holder is at a maximum distance from the base plate to a second position in which the punch holder is at a minimum distance from the base plate;

said punch holder having $2^n$ punch holes and p punch pilot holes each of said punch and punch pilot holes having a longitudinal axis, said punch and punch pilot holes in the punch holder being positioned so that said punch and punch pilot holes can be aligned with corresponding die pin and die pilot holes in the die;

means for mounting the punch holder on the lower surface of the top plate so that the longitudinal axis of said punch and punch pilot holes substantially coincide with the longitudinal axis of corresponding die pin and die pilot holes of the die;

a pilot pin fixedly mounted in each of the pilot holes of the punch holder;

$2^n$ piercing punches positioned so that one is located in each of the punch holes of the punch holder for limited reciprocal movement therein; each of said piercing punches having an enlarged head;

$2^n$ backup pin holes formed in the punch holder, each of the backup pin holes having a longitudinal axis, said backup pin holes being positioned so that the longitudinal axis of the backup pin holes substantially coincide with the longitudinal axis of the die pin holes;

a plurality of punch backup pins;

a punch backup plate removably mounted on the upper surface of the punch holder between a first position in which the backup pin holes of the punch holder are accessible and backup pins placed in said holes are free to move vertically and a second position in which each backup pin placed in a backup pin hole is held in contact with the head of a piercing punch, a backup pin when positioned in a backup pin hole in the top plate and with the backup plate in its second position, prevengint movement relative to the top place of the piercing punch whose head the backup pin contacts;

the lengths of the piercing punches and the pilots being such that they lie within the corresponding openings of the lower punch guide plate when the top plate is in its first position; and when the top plate is in its second position, the pilots project into the pilot holes of the die and each piercing punch in contact with a backup pin projects into its corresponding die, pin hole and the piercing punches not in contact with a backup pin are not forced into their corresponding pin holes.

2. A coding system as defined in claim 1 in which n=5.

3. A coding system as defined in claim 2 in which p=4.

* * * * *